United States Patent [19]

Walker

[11] Patent Number: 4,576,832

[45] Date of Patent: Mar. 18, 1986

[54] SELF-ALIGNING MASK

[75] Inventor: George A. Walker, Hopewell Junction, N.Y.

[73] Assignee: International Business Machines Corporation, Armonk, N.Y.

[21] Appl. No.: 640,223

[22] Filed: Aug. 13, 1984

Related U.S. Application Data

[63] Continuation of Ser. No. 454,899, Dec. 30, 1982, abandoned.

[51] Int. Cl.$^4$ ............................................. B05D 3/06
[52] U.S. Cl. .................................. 427/43.1; 430/966; 430/967
[58] Field of Search ................. 427/43.1, 36; 430/967, 430/966, 5

[56] References Cited

U.S. PATENT DOCUMENTS

| | | | |
|---|---|---|---|
| 3,742,229 | 6/1973 | Smith et al. | 430/967 |
| 3,742,230 | 6/1973 | Spears et al. | 430/5 |
| 4,018,938 | 4/1977 | Feder et al. | 430/967 |
| 4,022,927 | 5/1977 | Pfeiffer et al. | 430/967 |
| 4,349,621 | 9/1982 | Cline | 430/967 |
| 4,379,833 | 4/1983 | Canavello et al. | 427/96 |

OTHER PUBLICATIONS

"Handbook of Chemistry and Physics", pp. E-111, E-112, The Chemical Rubber Co., Cleveland, Ohio (1964).

Primary Examiner—John H. Newsome
Attorney, Agent, or Firm—Sughrue, Mion, Zinn, Macpeak, and Seas

[57] ABSTRACT

A process for forming a self-aligned resist mask over a surface of an alumina ceramic substrate having a conductive molybdenum pattern at said surface by first blanket coating the surface with a negative resist sensitive to aluminum emitting X-rays. A blanket dosing of the substrate with resist insensitive X-rays occurs to induce X-ray emission by the aluminum of said substrate to penetrate said resist. The aluminum X-ray emission is screened by said molybdenum pattern at the surface and the resist adjacent the surface molybdenum pattern is penetrated by the aluminum X-ray emission. The resist is developed for removal thereof over the molybdenum pattern while retaining the resist doped by said aluminum X-ray emission. Further metalization can be accomplished by evaporation or sputtering to blanket coat the developed resist with a conductive metal followed by removal of the resist with the metal coating thereon such that the metal coating is retained on the molybdenum pattern.

13 Claims, 5 Drawing Figures

SELF-ALIGNING MASK

This application is a continuation of application Ser. No. 454,899, filed Dec. 30, 1982 now abandoned.

BACKGROUND OF THE INVENTION

This invention relates to the construction of improved masks used in the generation of patterns employed in the production of integrated circuits. In particular, this invention relates specifically to a self-aligning mask used in a multi-layer ceramic (MLC) device.

An MLC is a multi-layer ceramic packaging substrate. Numerous layers, in the order of 20-30 are employed, each made of a ceramic material and having an electrically conductive personalized wiring pattern. The layers are stacked to define within the stack power layers, signal layers, redistribution layers and the like all interconnected.

A large number of VLSI chips are mounted on the top of the substrate which in turn establishes all electrical connections to and between those chips. On the top portion of the substrate, each chip site has a central array of contact pads, I/O connections and the like surrounded by one or more frames of engineering pads. Such MLC devices are described in greater detail in: A. J. Blodgett and D. R. Barbour-"Thermal Conduction Module: A High-Performance Multilayer Ceramic Package". I.B.M. Journal of Research and Development, Vol. 26, No. 1, January 1982; G. A. Walker, "Failure Analysis of Multilayer Ceramic Substrates", 18th Annual Proceedings, Reliability Physics, 1980 IEEE Catalog No. 80CH1531-3.

The MLC ceramic is a fired $Al_2O_3$ substrate having on its top layer the above-described features utilizing molybdenum metallurgy. Following firing, additional metallurgy is required on the Mo features to provide chip, I/O, pin and flange joining. Currently, metal plating is used to define this metallurgy. Such plating techniques constitute a major process problem in the fabrication of the complete MLC. Plating may, for example, be extraneous and located where it is not needed. It may bridge between features or conversely not be present and not plate certain features. Bath chemistry and control for accurate plating is complex. For example, thickness control, normally the time in the bath is difficult to accurately replicate. The effect of impurities co-deposited both in terms of bulk and surface is a serious problem. Finally, there is a severe environmental impact on the dumping and disposal of used baths. Cost considerations, processing difficulties and the introduction of defects in the product also detract from the overall yield of the final device. Given the extensive processing (many months) needed to reach these final steps, processing which detracts from the overall yield rate must therefore be minimized. Moreover, separate masking steps are not always accurately aligned with the existing metalization so that errors occur in the plating step requiring extensive operator time to correct. Accordingly, there exists a need to define an improved technique for acceptable metallurgical definition following firing of the MLC product.

The prior art is replete with a host of proposals for using various masks and alignment systems in conjunction with X-ray lithography techniques. Typical are various systems proposed in U.S. Pat. Nos. 3,740,280; 3,742,229; 3,742,230; 3,743,842; 3,767,398; 4,022,927; and 4,035,522. Reference is made to U.S. Pat. No. 4,018,938 defining a method of constructing aligned masks utilizing X-ray illumination through the back side of the substrate. On top of an intermediate product comprising a substrate 10 having a thin plating layer 12 with plated areas 17, an additional resist is coated over the entire surface. The substrate is then illuminated by X-rays having a wavelength of approximately 8.3 Å to expose portions of the second resist which are not protected by the plated areas. Those plated areas modulate the X-ray illumination, i.e., serving as the mask itself to avoid misregistration. The resist is then developed such that the unexposed areas leave holes directly above the plated areas. A second plating operation is then carried out to increase the height of the plated areas and both resist layers are removed leaving a final product having a suitable high aspect ratio.

Reference is also made to U.S. Pat. No. 4,215,192 which is also directed to X-ray lithography utilizing a mask membrane having absorbers interposed between the X-ray source and a resist coated on top of a substrate for processing. A reduction in exposure time is achieved by utilizing tungsten as a target to permit operation at higher power densities. While offering advantages in terms of processing times, the system does not achieve the necessary self-aligning for use in MLC products having an extensive highly dense array of metalization at the top layers.

The prior art also includes a number of different proposals for resist materials for use in X-ray lithography systems. Typical are various resist processing techniques as set forth in IBM TDB, Vol. 18, No. 7, pp. 2344-2347, December 1975; IBM TDB, Vol. 19, No. 11, p. 4193, April 1977; Taylor "X-Ray Resist Materials", *Solid State Technology*, May 1980, page 73; U.S. Pat. No. 4,061,829; and Haller et al, "High Resolution Positive Resist for Electron Beam Exposure", IBM Journal, pp. 251-256, May 1968.

Accordingly, while the prior art offers a number of X-ray lithography processing techniques and a host of resist materials of choice, there exists a need in this technology to define a process which is self-aligning in the context of a highly complex molybdenum metallurgy pattern on the top surface of an $Al_2O_3$ ceramic substrate. Such a self-aligning mask would remove a significant processing limitation in eliminating the plating requirement for final metalization in the formulation of a complete MLC.

SUMMARY OF INVENTION

Given these deficiencies in the prior art, it is an object of this invention to define a method of forming a resist mask over the surface of a dielectric substrate that is self-aligning and eliminates the requirement of subsequent metal plating.

Yet another object of this invention is to define a process utilizing X-ray radiation to induce X-ray emission by the metal component of the ceramic substrate for purposes of developing a photoresist disposed over the top surface of a MLC.

A further object of this invention is to define a process of forming a self-aligned resist mask over an alumina ceramic substrate having a conductive molybdenum pattern at the surface.

These and other objects of this invention are attained by utilizing a method of forming a resist mask over the surface of a dielectric $Al_2O_3$ ceramic substrate having thereon a conductive molybdenum pattern. A blanket coating of an Al X-ray sensitive resist is applied. The substrate is subsequently dosed with X-rays to induce X-ray emission by the aluminum in the substrate. The resist is however unaffected by the X-ray illumination—it is sensitive only to the induced X-ray emission. At portions where the Mo features exist, very little Al X-ray excitation occurs having no resulting effect on the overlying photoresist. Thus, the resist adjacent the surface molybdenum pattern is penetrated by the aluminum X-ray emission and hardened while those areas over the metallurgy pattern are not so doped. In a known technique, the negative resist is then developed for removal of only those "soft" portions over the molybdenum pattern yet retaining the resist doped by the aluminum X-ray emission. This defines a self-aligned mask for subsequent processing since the Mo features themselves determine the areas which are doped. The mask is therefore suitable for either evaporation or sputter coating, eliminating the requirement of the prior art technique of plating.

This invention will be described in greater detail with reference to the attached drawing and the description of the preferred embodiment that follow.

DESCRIPTION OF THE PREFERRED EMBODIMENT

Figure 1A:
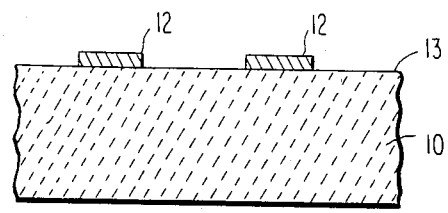
FIGS. 1A through 1E, inclusive, are cross-sections of the product produced by the process of this invention in various stages of fabrication.

Referring first to FIG. 1A, a cross-section of a portion of a MLC product after firing is depicted. The fired substrate 10 is an $Al_2O_3$ ceramic having thereon molybdenum metallurgy 12. The metallurgy patterns 12 formed on the top surface 13 define various contact points for I/O pins, flange joining, chip connections, engineering change pads and the like. FIG. 1A is highly schematic, showing only several features, eliminating the layering and personalization inherent in an MLC. It will be appreciated that such detail is not required to described this invention. Additional metal definition is required to define those connections to the Mo metallurgy 12. The prior art technique of plating has exhibited a number of processing problems as explained herein.

Figure 1B:
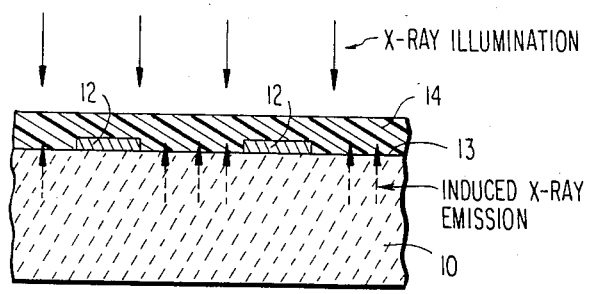

In accordance with the present invention as shown in FIG. 1B, an aluminum X-ray sensitive photoresist 14 is applied over the surface of the MLC. The photoresist selected from: Hydrocarbon Resist, Brominated Tetrathiafulvalen—functionalized Poly(styrene), Metal Acrylates, T-1 Poly(methylmethacrylate-co-methacrylic acid) or Poly(methyl methacrylate) covers the substrate surface 13 and the molybdenum metallurgy 12. The typical thickness of the resist 14 is sufficient to suitably cover yet provide holes of suitable depth for subsequent metalization. That is, the resist 14 is a negative resist such that unexposed areas are removed.

X-ray illumination takes place at suitable energy levels with dosages adjusted to be below the sensitivity of the particular resist employed. The dosage ranges from tens of $mj/cm^2$ to hundreds of $mj/cm^2$ which will not sensitize the photoresist 14 but are capable of exciting Al X-rays from the $Al_2O_3$ substrate. That is, the resist 14 is insensitive to X-ray illumination. It is, however, sensitive to induced X-ray emission by the aluminum of the substrate 10 such that such emissions penetrate the resist in areas not screened by the molybdenum pattern 12.

It is known that, $Mo\ K\alpha\lambda = 0.7107\ Å$ $Al\ K\alpha\lambda = 8.338\ Å$ therefore, $\Delta\lambda = 7.628$ Consequently, the molybdenum serves to modulate the X-ray emissions by the aluminum such that the metalization pattern itself defines the particular resist pattern which will remain insensitive to the induced aluminum X-ray emissions. As a result of this induced X-ray emission, those portions of the resist 14 which are exposed to aluminum X-ray emission are doped and hardened to impede removal. Conversely, the areas above the Mo are unaffected.

Figure 1C:
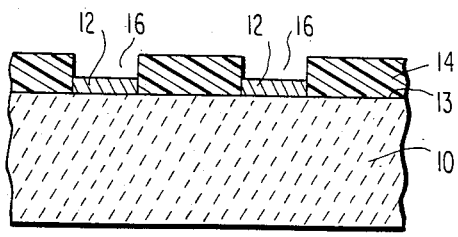
Figure 1D:
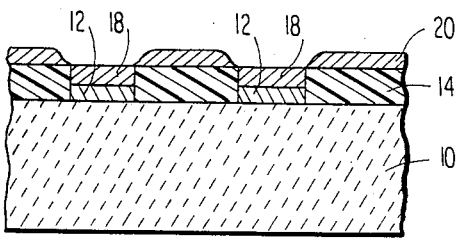
Figure 1E:
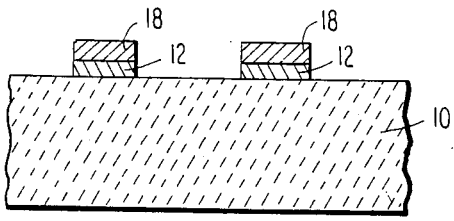

FIG. 1C shows the intermediate product wherein the negative resist 14 has been processed in a known manner to remove it from the top surfaces of the Mo features leaving holes 16 in the pattern 14. Thus, as shown in FIG. 1C, a mask is produced which is self-aligned with the molybdenum metallurgy. Given the inherent self-aligned nature of the mask, coating by evaporation or sputtering of subsequent metallurgy can be easily achieved. By use of those techniques, a second level of metalization 18 is deposited into the holes 16 as shown in FIG. 1D. This is an important advantage given the inherent alignment of the mask 14 with the metalization pattern. By using sputter or evaporation techiques, a blanket coating of metal 20 results. However, as shown in FIG. 1E, when the resist 14 is removed, the excess blanket metal coating 20 is also removed leaving a metal layer 18 retained on the molybdenum pattern 12.

Thus, in accordance with the present invention, a method is defined wherein a resist mask is produced over a molydbenum metallurgy pattern that is self-aligning and requires no intermediate masks itself. The molybdenum defines its own masking pattern which is doped by emissions from the induced aluminum X-ray emission. This technique eliminates the requirement of plating top surfaces of the MLC heretofore a difficult, expensive, and time-consuming process.

While the invention has been described relative to an $Al_2O_3$ substrate with Mo metalization it is apparent that the invention can be practiced with other materials so long as the $\Delta\lambda$ is sufficiently large. In such a case the resist material will be chosen to be responsive to the particular induced X-rays of the metal component of the ceramic substrate. Hence for a Cu conductor on glass ceramics such as Mg, Al silicates (cordierite)

$Cu\ K\alpha\lambda = 1.542\ Å$ $Al\ K\alpha\lambda = 8.338\ Å$ therefore, $\Delta\lambda = 6.796$ It is apparent that other combinations of materials and modifications of this invention can be practiced without departing from the essential scope thereof.

I claim:

1. A method of forming a resist mask over a surface of a dielectric substrate having a metallurgy pattern on said surface comprising the steps of:
   blanket coating said surface with said resist;

exposing said surface to resist insensitive X-rays that induce resist sensitive X-ray radiation from portions of said dielectric substrate not masked by said metallurgical pattern; and developing said exposed resist for removal thereof of portions only over said metallurgical pattern to produce a self-aligned resist mask.

2. The process of claim 1 further including the steps of: blanket coating the resist mask with a conductive metal and, removing said resist mask together with said metal coating thereon while retaining said metal coating on said metallurgy pattern.

3. The process of claim 2, wherein the step of blanket coating a conductive metal comprises sputter coating.

4. The process of claim 2, wherein the step of blanket coating a conductive metal comprises vacuum evaporation coating.

5. The process of claim 1, wherein said dielectric substrate is $Al_2O_3$ and said resist sensitive X-ray radiation is Al excited X-ray emission.

6. The process of claim 5, wherein said metallurgy pattern comprises a conductive molybdenum pattern.

7. The process of claim 5, wherein said metallurgy pattern comprises a conductive copper pattern.

8. The process of claim 1, wherein said resist is selected from the group consisting of: Hydrocarbon Resist, Brominated Tetrathiafulvanlene—functionalized Poly(styrene), Metal Acrylates, T-1 Poly(methylmethacrylate-co-methacrylic acid) or Poly(methyl methacrylate).

9. A process for forming a self-aligned resist mask over a surface of an alumina ceramic substrate having a conductive molybdenum pattern on said surface, comprising the steps of:

blanket coating said surface with a negative resist sensitive to aluminum emitted X-rays;

blanket exposure of said substrate with resist insensitive X-rays to induce X-ray emission by the aluminum in said substrate to penetrate said resist with said aluminum X-ray emission, said aluminum X-ray emission screened by said molybdenum pattern on said surface, whereby said resist adjacent said surface molybdenum pattern is penetrated by said aluminum X-ray emission and blocked in portions over said pattern; and developing said resist for removal thereof of portions over said molybdenum pattern while retaining said resist doped by said aluminum X-ray emission.

10. The process of claim 9, further comprising the steps of; developing resist with a conductive metal; and removing said resist with said metal coating thereon while said metal coating on said molybdenum pattern is retained.

11. The process of claim 10, wherein the steps of blanket coating is sputtering.

12. The process of claim 11, wherein the step of blanket coating is vacuum evaporation.

13. The process of claim 10, wherein said negative resist is selected from the group consisting of: Hydrocarbon Resist, Brominated Tetrathiafulvalene—functionalized Poly(styrene), Metal Acrylates, T-1 Poly(methylmethacrylate-co-methacrylate acid) or Poly(methyl methacrylate).

* * * * *